United States Patent
An et al.

(10) Patent No.: US 7,772,834 B2
(45) Date of Patent: Aug. 10, 2010

(54) HANDLER AND PROCESS FOR TESTING A SEMICONDUCTOR CHIPS USING THE HANDLER

(75) Inventors: Jung Ug An, Cheonan-Si (KR); Wan Hee Choi, Cheonan-Si (KR); Hae Jun Park, Asan-Si (KR); Kyeong Tae Kim, Suwon-Si (KR)

(73) Assignee: Mirae Corporation, Cheonan-si, Chungcheongnam-Do (KR)

( * ) Notice: Subject to any disclaimer, the term of this patent is extended or adjusted under 35 U.S.C. 154(b) by 0 days.

(21) Appl. No.: 12/182,681

(22) Filed: Jul. 30, 2008

(65) Prior Publication Data
US 2009/0033352 A1 Feb. 5, 2009

(30) Foreign Application Priority Data
Jul. 30, 2007 (KR) .................. 10-2007-0076182

(51) Int. Cl.
*G01R 31/28* (2006.01)
(52) U.S. Cl. .................................. 324/158.1
(58) Field of Classification Search ................. None
See application file for complete search history.

(56) References Cited

U.S. PATENT DOCUMENTS

| 6,873,169 | B1 * | 3/2005 | Ham et al. | 324/755 |
| 7,196,508 | B2 * | 3/2007 | Ham et al. | 324/158.1 |
| 7,208,938 | B2 * | 4/2007 | Song | 324/158.1 |
| 2009/0261817 | A1 * | 10/2009 | Beom et al. | 324/158.1 |

* cited by examiner

*Primary Examiner*—Ha Tran T Nguyen
*Assistant Examiner*—Roberto Velez
(74) *Attorney, Agent, or Firm*—KED & Associates LLP

(57) ABSTRACT

A test handler includes a loading unit including a loading picker and a loading ascending/descending unit, an unloading unit including an unloading picker and an unloading ascending/descending unit, and a chamber system. A passage site connects the loading unit and the chamber system, and also connects the chamber system and the unloading unit. The arrangement of the handler reduces the time for the loading and unloading processes by performing the loading and unloading processes on separate test trays located at separate loading and unloading positions.

17 Claims, 13 Drawing Sheets

HANDLER AND PROCESS FOR TESTING A SEMICONDUCTOR CHIPS USING THE HANDLER

BACKGROUND

1. Field

The present application discloses a test handler for transferring a test tray containing packaged semiconductor chips so that electrical tests can be performed on the packaged chips, and a process for testing the semiconductor chips using the handler.

2. Background

A test handler may be used to perform electrical tests on packaged chips at the conclusion of a packaging process. Such a handler transfers packaged chips from a user tray to a test tray and supplies the test tray containing the packaged chips to a tester. The tester includes a test board having a plurality of sockets. The packaged chips in the test tray are brought into contact with the sockets to perform an electrical test on the packaged chips. The packaged chips are graded according to the test results, and the handler transfers the graded chips from the test tray to appropriate user trays based on the grading.

FIG. 1 is a top view of a configuration for a conventional handler. FIG. 2 is a view of a path which a test tray T follows in the handler. The reference numbers in FIG. 2 indicate the locations within the handler where the test tray T is positioned.

As shown in FIGS. 1 and 2, the handler 10 includes a chamber system 11, a loading stacker 12, an unloading stacker 13, a picker system 14, a buffer unit 15, and an exchanging site 16. The chamber system 11 includes the first chamber 111, a second chamber 112, and a third chamber 113. Within the first chamber 111, the packaged chips in the test tray T are heated or cooled to a testing temperature which is predetermined depending upon a user's quality requirements. After the packaged chips are heated or cooled to the testing temperature, the test tray is transferred from the first chamber 111 into the second chamber 112.

Within the second chamber 112, the packaged chips in the test tray T are brought into contact with sockets of a test board A. Thereafter, electrical tests are performed on the packaged chips. This is referred to as "a testing process". The test board A is coupled to the second chamber 112.

After the packaged chips are tested, the test tray is transferred from the second chamber 112 into the third chamber 113. Within the third chamber 113, the packaged chips in the test tray T are cooled or heated to room temperature.

Thereafter, the test tray T is transferred from the second chamber 113 to the exchanging site 16.

A plurality of user trays, each containing packaged chips intended for the electrical tests, stay at the loading stacker 12. A plurality of user trays, each containing tested packaged chips, may stay at the unloading stacker 13.

The picker system 14 includes a first picker 141, a second picker 142, a third picker 143, and a fourth picker 144. Each of the first picker 141, the second picker 142, the third picker 143, and the fourth picker 144 pick up a plurality of the packaged chips and transfer the chips between the user trays, a buffer and the test tray. The first picker 141 and the second picker 142 transfer the packaged chips intended for the electrical tests, from the user trays at the loading stacker 12 to a test tray T located at the exchanging site 16. This is referred to as a "loading process". More specifically, the first picker 141 picks up the packaged chips intended for the electrical tests from the user trays at the loading stacker 12 and places them on the buffer unit 15. The first picker 141 moves in X-axis and Y-axis directions. The first picker 141 also ascends and descends.

The second picker 142 picks up the packaged chips intended for the electrical tests from the buffer unit 15 and places them into a test tray T at the exchanging site 16. The second picker 142 moves in the X-axis direction, and also ascends and descends.

The third picker 143 and the fourth picker 144 transfer the tested packaged chips from a test tray T at the exchanging site 16 to the user trays at the unloading stacker 13. This is referred to as an "unloading process". More specifically, the third picker 143 picks up the tested packaged chips from a test tray T at the exchanging site 16 and places them on the buffer unit 15. The third picker 143 moves in the X-axis direction, and also ascends and descends. The fourth picker 144 picks up the tested packaged chips from the buffer unit 15 and places them into the user trays at the unloading stacker 13. The fourth picker 144 moves in the X-axis and Y-axis directions. The fourth picker 144 also ascends and descends.

The picker system 14 may include a plurality of the first pickers 141, a plurality of the second pickers 142, a plurality of the third pickers 143, and a plurality of the fourth pickers 144.

The buffer unit 15, where the packaged chips are temporarily placed, moves in the Y-axis direction. The buffer unit 15 may include a first buffer 151 and a second buffer 152. Further, each of the first and second buffers may include individual elements that can move independently in the Y-axis direction.

The first buffer 151 is provided adjacent to one side of the exchanging site 16. The packaged chips intended for the electrical tests are placed on the first buffer 151.

The second buffer 152 is provided adjacent to the other side of the exchanging site 16. The tested packaged chips may be placed on the second buffer 152.

When a test tray T containing chips that have already been tested arrives at the exchanging site 16, the tested packaged chips are picked up from the test tray T, and the packaged chips intended for the electrical tests are placed into the empty test tray T. The third picker 143 picks up the tested packaged chips from the test tray T and places them on the second buffer 152, and then the second picker 142 picks up the packaged chips intended for the electrical tests from the first buffer 151 and places them into the test tray T.

After the tested packaged chips are replaced with new packaged chips intended for the electrical test at the exchanging site 16, the test tray T is transferred from the exchanging site 16 to the chamber system 11. After the packaged chips are tested by the tester within the chamber system 11, the test tray T is transferred from chamber system 11 to the exchanging site 16.

The exchanging site 16 may further include a rotating unit 161. The rotating unit 161 rotates a test tray containing the packaged chips intended for the electrical tests from a horizontal position to a vertical or upright position. The test tray T remains in the upright position during its transfer within the chamber system 11.

The rotating unit 161 may rotate an upright-positioned test tray containing tested packaged chips from a vertical position to a horizontal position. The test tray T remains in the horizontal position while the tested packaged chips are picked up from it and then the new packaged chips intended for the electrical tests are placed into it.

The conventional handler 10 has several disadvantages. For the sake of efficiency, the tested packaged chips are picked up from the test tray T at the same time that the packaged chips intended for the electrical tests are placed into the empty test tray T. Because the loading and unloading operations are conducted at the same time, the various pickers may interfere with each other during the loading and unloading process. This not only makes it difficult to effectively control the unloading and loading processes, but also puts a limit on reducing the time for unloading the tested packaged chips from the test tray T and loading the packaged chips intended for the electrical tests into the test tray T.

BRIEF DESCRIPTION OF THE DRAWINGS

The embodiments will be described in detail with reference to the following drawings, in which like reference numerals refer to like elements, and wherein.

DETAILED DESCRIPTION

Figure 1:
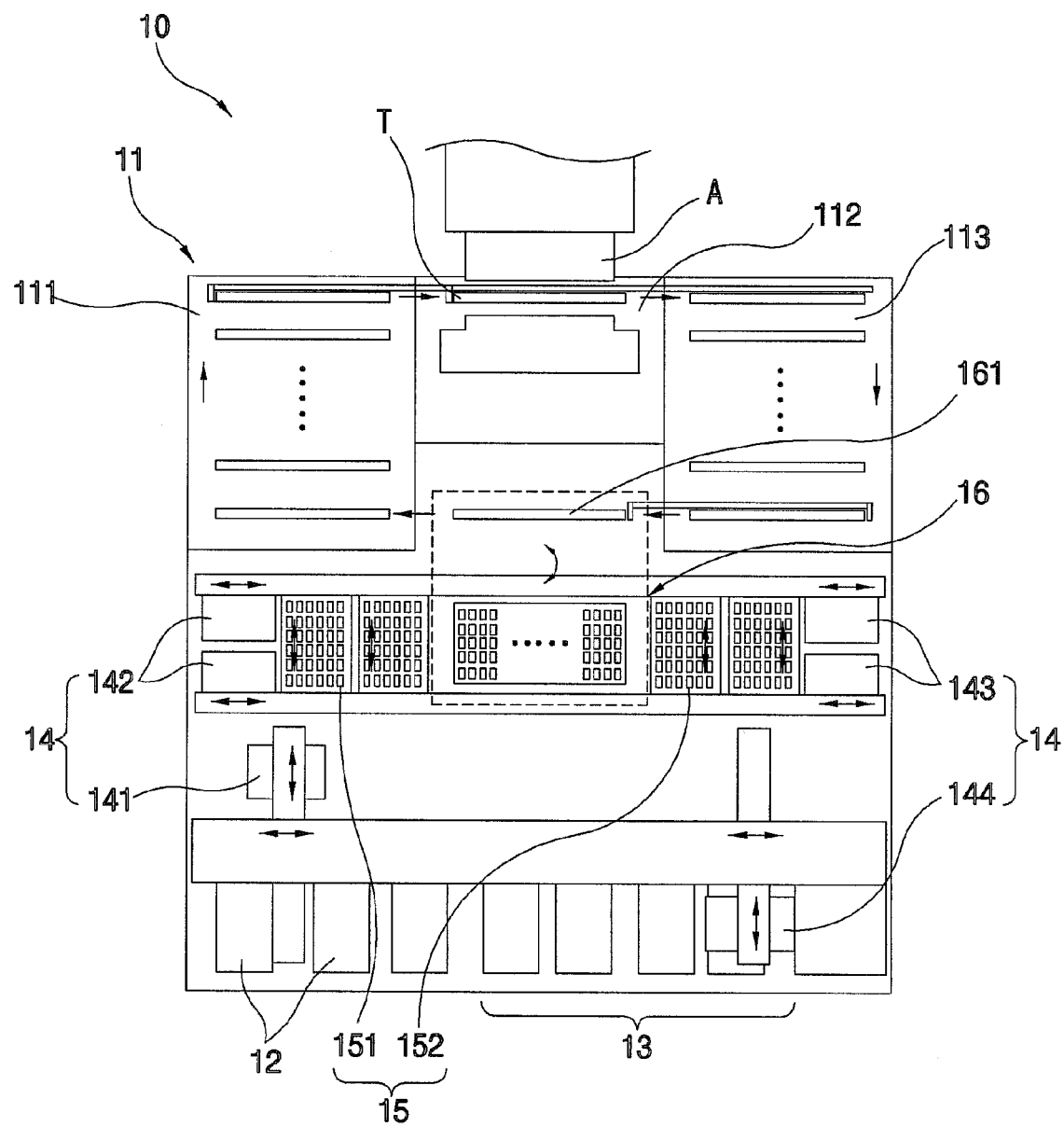
FIG. 1 is a top view of a configuration for a conventional hander.
Figure 2:
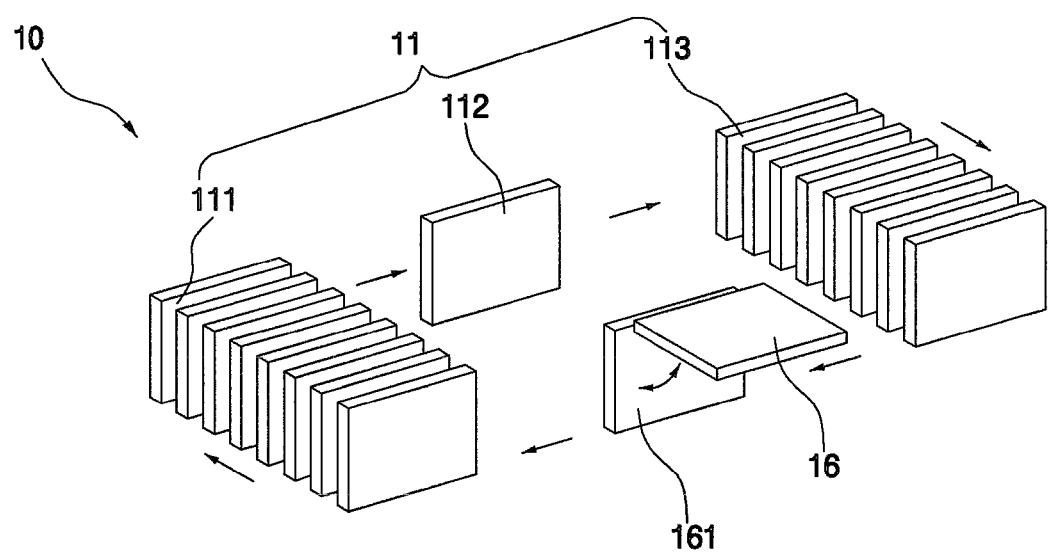
FIG. 2 is a view of a path which a test tray T follows in the handler.

Reference will now be made in detail to preferred embodiments, examples of which are illustrated in the accompanying drawings.

As shown in FIGS. 3-9, a first embodiment of a handler 1 according to the present invention includes a loading unit 2, an unloading unit 3, a passage site 4, a chamber system 5, and a transferring unit 6.

The loading unit 2 performs a process of loading packaged chips intended for electrical test into a test tray. The loading unit 2 includes a loading stacker 21, a loading picker 22, a loading ascending/descending unit 23, a loading guiding member 24, and a loading stopper 25.

At the loading stacker 21, a plurality of user trays are stacked, each containing the packaged chips intended for the electrical tests. The loading picker 22 picks up the packaged chips intended for the electrical tests from the topmost user tray that stays on the highest part at the loading stacker 21. The loading unit 2 may include a plurality of the loading stackers 21.

The loading picker 22 moves in the X-axis and Y-axis directions. The loading picker 22 also ascends and descends. The loading picker 22 picks up a plurality of the packaged chips at a time. The handler 1 may include a plurality of the loading pickers 22 (not shown).

The loading picker 22 picks up the packaged chips intended for the electrical tests from the loading stacker 212 and places them into a test tray T located at a loading position 2a. The test tray T, when containing the packaged chips intended for the electrical tests, stays at a loading position 2a.

Once a test tray T is fully loaded, the loading ascending/descending unit 23 then moves the test tray T from the loading position 2a to a departing position 2b located under the loading position 2a. The test tray T containing the packaged chips intended for the electrical tests descends from the loading position 2a to the departing position 2b. Thereafter, the test tray T is transferred to the passage site 4. The departing position 2b is located at the same height as the passage site 4.

As shown FIGS. 3-7, the loading ascending/descending unit 23 includes a loading ascending/descending member 231, a first loading supporter 232, and a second loading supporter 233. The loading ascending/descending member 231 descends from the loading position 2a to the departing position 2b and ascends from the departing position 2b to the loading position 2a. The loading ascending/descending member 231 is enabled to ascend and descend by one or more pneumatic or hydraulic cylinders 231a, or some other moving mechanism.

The first loading supporter 232 is coupled to the loading ascending/descending member 231 and supports one side of the test tray T. The first loading supporter 232 supports only a portion of a lower upper side of the test tray T, adjacent to a first side T1 of the test tray T. The first side T1 of the test tray T is the lateral side which is at a shortest distance from the unloading unit 3 when the horizontal-positioned test tray T is located at the loading unit 2. As a result, the test tray T, when transferred from the unloading unit 3 to the loading position 2a and from departing position 2b to the passage site 4, does not collide with the first loading supporter 232. This makes it unnecessary to move the first loading supporter 232, thereby reducing the time for the test trays T to wait.

The second loading supporter 233 is also coupled to the loading ascending/descending member 231. The second loading supporter 233 also supports the test tray T. The second loading supporter 233 supports only a portion of the lower side of the test tray T, adjacent to a second side T2 of the test tray T. The second side T2 is opposite to the first side T1. The second loading supporter 233 may further include at least a loading supporting member 233a that is brought into contact with the second side T2 of the test tray T. The loading supporting member 233a functions as a stopper, when the test tray T is transferred from the unloading unit 3 to the loading position 2a.

The loading guiding member 24 guides motion of the test tray T at the loading position 2a when the test tray T is transferred from the unloading unit 3 to the loading position 2a. Third side T3 and fourth side T4 of a test tray T are inserted into the loading guiding member 24. The third side T3 and fourth side T4 are opposite to each other. The loading guiding member 24 may include a one or more first loading guiding members 241 and one or more second loading guiding members 242.

The two first loading guiding members 241 may be provided, such that one which is brought into contact with both of the third side T3 of the test tray T and the portion of the upper side of the test tray T, adjacent to the third side T3 of the test tray T, and the other which is brought into contact with both of the fourth side T4 of the test tray T and the portion of the upper side of the test tray T, adjacent to the fourth side T4 of the test tray T. The first loading guiding members 241 are fixedly provided to a loading frame G that is positioned at the loading position 2a.

The two second loading guiding members 242 may be provided, one supporting the portion of the lower side of the test tray T, adjacent to the third side T3 of the test tray T and the other supporting the portion of the lower side of the test tray T, adjacent to the fourth side T4 of the test tray T. The second loading guiding members 242 are located under the first loading guiding members 241.

The second loading guiding members 242 are movably mounted to the loading frame G. The second loading guiding members 242 move in the direction (shown as an arrow Z in FIG. 7) perpendicular to the direction in which the test tray T is transferred from the unloading unit 3 to the loading position 2a. The second loading guiding members 242 may be moved by a pneumatic or a hydraulic cylinder 242a, or by other moving mechanisms.

The second loading guiding members 242 move towards each other into a position at which they support the lower side of the test tray T when the packaged chips are loaded into the test tray T while the test tray T is located staying at the loading position 2a. That is, the second loading guiding members 242 move close to each other. As a result, a test tray T can be transferred from the unloading unit 3 to the loading position 2a, without positioning the first loading supporter 232 and the second loading supporter 233 at an upper position to support the test tray T located at the loading position 2a. This means that another test tray T may be transferred from the unloading unit 3 to the loading position 2a, while a second test tray descends to the departing position under the action of by the loading ascending/descending unit 23. Also, another test tray T can be transferred from the unloading unit 3 to the loading position 2a while one test tray T is transferred from the departing position 2b to the passage site 4. This makes it possible to reduce the time that a test tray T must wait.

The second loading guiding members 242 are moved away from each other to allow a test tray T containing the packaged chips intended for the electrical tests to descend from the loading position 2a to the departing position 2b. That is, the second loading guiding members 242 move far away from each other. As a result, a test tray T may descend from the loading position 2a to the departing position 2b without colliding with the second loading guiding members 242.

The loading stopper 25 may include at least one or more loading protruding members 251 which are brought into contact with the second side T2 of the test tray T when the test tray T is moved into the loading position 2a. The loading stopper 25 functions as a stopper when the test tray T is transferred from the unloading unit 3 to the loading position 2a. Thus, the stopper 25 enables the test tray T to be located exactly at the loading position 2a, without the first and second loading supporters 232 and 233 being positioned at the loading position 2a.

The loading stopper 25 may be detachably coupled to the loading frame G that is located at the loading position 2a. This is done to enable an operator to detach the loading stopper 25 from the loading frame G to conveniently remove a test tray T when a malfunction occurs during the loading process.

As shown in FIGS. 3 through 9, the loading unit 2 may further include a loading pushing unit 26.

A test tray T may include a plurality of carrier modules, into each of which one packaged chip is placed. Each carrier module includes a rotatable latch holding the packaged chip firmly in place.

The loading pushing unit 26 causes the latches in the carrier modules to open. This is done to enable the loading picker 22 to place the packaged chips into the carrier modules. The loading pushing unit 26 includes a loading pushing member 261 and a loading mechanical actuator 262 (shown in FIG. 7).

The loading pushing member 261 is coupled to the loading ascending/descending member 231. The loading pushing member 261 may include a plurality of pushing pins 2611, each pushing the latch of one of the carrier modules. The pushing pins 2611 push the latches to rotate them when the loading pushing member 261 ascends. As a result, the carrier modules can be opened. The loading picker 22 can then place the packaged chips into the carrier modules.

Conversely, when the loading pushing member 261 descends, the pushing pins 2611 release the latches, which allows them to rotate it the opposite direction. As a result, the latches close to hold the packaged chips firmly in place.

The loading pushing unit 26 may include a plurality of the loading pushing members 261. In this case, the loading pushing members 261 may ascend and descend, independently of each other. By configuring the loading pushing unit 26 in this way, the loading pushing unit 26 can push a specific number of the pins, to open the latches on a specific number of the carrier modules.

The number of the packaged chips that the loading picker 22 picks up simultaneously at a time is smaller than the total number of the carrier modules in a test tray T. Thus, the loading picker 22 is required to repeatedly pick up the packaged chips from the loading stacker 21 and place them into the test tray T staying at the loading position 2a, until all the carrier modules are filled with the packaged chips. During this process, if the loading pushing unit 26 pushes the pins to open the latches on all of the carrier modules in a test tray T, all carrier modules will remain open, which means and the test tray T and the loaded chips may be exposed to damage.

To prevent this, the loading pushing unit 26 may include a plurality of independently movable the loading pushing members 261. The loading pushing unit 26 pushes the pins to selectively open only those carrier modules that are about to receive chips from the loading picker 22.

The loading pushing unit 26 may include a first loading pushing member 261a, a second loading pushing member 261b, a third loading pushing member 261c, and a fourth loading pushing member 261d. Accordingly, the test tray T may be divided into 4 areas. Of course, in alternate embodiments, a different number of areas and corresponding loading pushing members may be provided. Thus, the loading pushing unit 26 may selectively open the carrier modules belonging to only one area of the test tray T. The number of the areas opened simultaneously depends upon how many packaged chips the loading picker 22 picks up at a single time.

The second loading pushing member 261b is located adjacent to the first loading pushing member 261a. The third loading pushing member 261c is located adjacent to the second loading pushing member 261b. The fourth loading pushing member 261d is located adjacent to the third loading pushing member 261c.

The first and second loading pushing members 261a and 261b may ascend and descend together. Likewise, the third and fourth loading pushing members 261c and 261d may ascend and descend together.

The loading mechanical actuator 262 is mounted on the loading ascending/descending member 231 to enable the loading pushing member 261 to ascend and descend. The loading mechanical actuator may include one or more pneumatic or hydraulic cylinders, or some other type of moving device. The loading pushing unit 26 may include a plurality of the loading mechanical actuators 262. For instance, the loading pushing unit 26 may include a first loading mechanical actuator 262a, a second loading mechanical actuator 262b, a third loading mechanical actuator 262c, and a fourth loading mechanical actuator 262d.

The first loading pushing member 261a, the second loading pushing member 261b, the third loading pushing member 261c, and the fourth loading pushing member 261d are enabled to ascend and descend by the first loading mechanical actuator 262a, the second loading mechanical actuator 262b, the third loading mechanical actuator 262c, and the fourth loading mechanical actuator 262d, respectively.

The unloading unit 3 performs the unloading process. As shown in FIGS. 3-5 and 10, the unloading unit 3 includes an unloading stacker 31, an unloading picker 32, an unloading buffer 33, an unloading ascending/descending unit 34, an unloading guiding member 35, and an unloading stopper 36.

A plurality of the user trays, each containing the tested packaged chips, stay at the unloading stacker 31. The unloading picker 32 places the tested packaged chips into the user trays which stay on the highest part at the unloading stacker 31. The unloading unit 3 may include a plurality of the unloading stackers 31.

The unloading picker 32 moves in the X-axis and Y-axis directions. The unloading picker 32 also ascends and descends. The unloading picker 32 picks up a plurality of the packaged chips at a time. The unloading picker 32 may include a first unloading picker 321 and a second unloading picker 322.

The first unloading picker 321 picks up the tested packaged chips from a test tray T and places them on the unloading buffer 33. The test tray T is positioned at the unloading position 3a when the first unloading picker 321 picks up the tested packaged chips from the test tray T. The unloading picker 32 may include a plurality of the first unloading pickers 321.

The second unloading picker 322 picks up the tested packaged chips from the unloading buffer 33 and places them into the user trays staying at the unloading stacker 31. The second unloading picker 322 grades the tested packaged chips according to the test results and places the graded tested packaged chips into the corresponding user trays. The unloading picker 32 may include a plurality of the second unloading pickers 322.

The unloading buffer 33 is provided between the loading position 2a and the unloading position 3a. The unloading buffer 33 moves in the Y-axis direction. The tested packaged chips are temporarily placed on the unloading buffer 33. The unloading unit 3 may include a plurality of the unloading buffers 33, each of which is independently movable in the Y-axis direction.

The unloading buffer 33 moves toward the unloading stacker 31, before the test tray T is transferred from the unloading position 3a to the loading position 2a. As a result, a test tray T can be transferred from the unloading position 3a to the loading position 2a, without colliding with the unloading buffer 33.

The unloading ascending/descending unit 34 enables a test tray T to ascend from an arriving position 3b, located under the unloading position 3a, to the unloading position 3a. A test tray T, containing the tested packaged chips, is transferred from the passage site 4 to the arriving position 3b and then ascends from the arriving position 3b to the unloading position 3a. The arriving position 3b is located at the same height as the passage site 4 and the departing position 2b. Once all of the tested packaged chips are picked up from a test tray T at the unloading position 3a, the test tray T is transferred from the unloading position 3a to the loading position 2a. The unloading position 3a is located at the same height as the loading position 2a.

As shown in FIGS. 5 and 10-13, the unloading ascending/descending unit 34 may include an unloading ascending/descending member 341, a first unloading supporter 342, and a second unloading supporter 343.

The unloading ascending/descending member 341 ascends from the arriving position 3b to the unloading position 3a, and descends from the unloading position 3a to the arriving position 3b. The unloading ascending/descending member 341 is enabled to ascend and descend by one or more pneumatic or hydraulic cylinders 341a, or by some other type of moving mechanism.

The first unloading supporter 342 is coupled to the unloading ascending/descending member 341 to support the test tray T. The first unloading supporter 342 supports only the portion of the lower side of the test tray T, adjacent to the second side T2 of the test tray T. The first side T1 and the second side T2, the third side T3 and the fourth side T4, which follow, are the same as those which are above described.

As a result, the test tray T, when transferred from the passage site 4 to the arriving position 3b and from unloading position 3a to the loading position 2a, does not collide with the first unloading supporter 342. This makes it unnecessary to move the first unloading supporter 342, thereby reducing the time for the test trays T to wait.

The second unloading supporter 343 is coupled to the unloading ascending/descending member 341 to support the test tray T. The second unloading supporter 343 supports only the portion of the lower side of the test tray T adjacent to the first side T1 of the test tray T. The second unloading supporter 343 may further include at least one unloading supporting members 343a that are brought into contact with the first side T1 of the test tray T. The unloading supporting members 343a function as a stopper, when the test tray T is transferred from the passage site 4 to the arriving position 3b.

The unloading guiding member 35 guides motion of the test tray T at the unloading position 3a when the test tray T is transferred from the unloading position 3a to the loading position 2a. The third side T3 and the fourth side T4 are inserted into the unloading guiding member 35. The unloading guiding member 35 may include one or more first unloading guiding members 351 and one or more second unloading guiding members 352.

The two first unloading guiding members 351 may be provided such that one is brought into contact with both the third side T3 of the test tray T and a portion of an upper side of the test tray T adjacent to the third side T3 of the test tray T. The other first unloading guiding member 351 is brought into contact with both the fourth side T4 of the test tray T and a portion of the upper side of the test tray T, adjacent to the fourth side T4 of the test tray T. The first unloading guiding members 351 are fixedly provided to an unloading frame H that is located at the unloading position 3a.

The two second unloading guiding members 352 may be provided such that one supports the third side T3 and a the portion of the lower side of the test tray T, adjacent to the third side T3 of the test tray T and the other supports the fourth side T4 and a portion of the lower side of the test tray T, adjacent to the fourth side T4 of the test tray T. The second unloading guiding members 352 are located under the first unloading guiding members 351.

The second unloading guiding members 352 are movably mounted on the unloading frame H. The second unloading guiding members 352 moves in a direction (shown as an arrow Z in FIG. 11) perpendicular to the direction in which the test tray T is transferred from the unloading position 3a to the loading position 2a. The second unloading guiding members 352 can be moved by a pneumatic or a hydraulic cylinder 352a, or other suitable moving devices.

The second unloading guiding members 352 move to support the lower side of the test tray T when the packaged chips are picked from the test tray T while it is located at the unloading position 3a. That is, the second unloading guiding members 352 move towards each other to move underneath a test tray T. As a result, the test tray T can be supported at the unloading position, and the test tray can be transferred from the unloading position 3a to the loading position 2a, without positioning the first unloading supporter 342 and the second unloading supporter 343 at the unloading position 3a. That is, the test tray T can be supported at the unloading position and can then be transferred from the unloading position 3a to the loading position 2a, while the unloading ascending/descending member 341 descends at the arriving position 3b.

This also means that one test tray T can be transferred from the unloading position 3a to the loading position 2a, while another test tray T is transferred from the passage site 4 to the arriving position 3b. This makes it possible to reduce the time for the test tray T to wait.

The second unloading guiding members 352 move apart from each other before a test tray T containing the tested packaged chips ascends from the arriving position 3b to the unloading position 3a. As a result, the test tray T can ascend from the arriving position 3b to the unloading position 3a without colliding with the second unloading guiding members 352.

The unloading stopper 36 may include at least one unloading protruding member 361 which is brought into contact with the first side T1 of the test tray T while the test tray T is located at the unloading position 3a. The unloading stopper 36 is detachably coupled to the unloading frame H that is positioned at the unloading position 3a. This is done to enable an operator to detach the unloading stopper 36 from the unloading frame H to conveniently remove a test tray T, when a malfunction occurs during the unloading process.

As shown in FIGS. 3, 4, and 10-13, the unloading unit 3 may further include an unloading pushing unit 37. The unloading pushing unit 37 may include an unloading pushing member 371 and an unloading mechanical actuator 372.

The unloading pushing member 371 is coupled to the unloading ascending/descending member 341. The unloading pushing member 371 opens the latches of the carrier modules of the test tray T when the unloading ascending/descending member 341 ascends to be positioned at the unloading position 3a so that the tested chips can be removed from the carrier modules by the unloading picker. The unloading pushing member 371 may include a plurality of pushing pins 3711, each pushing the latch of one of the carrier modules of a test tray T.

The pushing pins 2611 push the latches to rotate them, to thereby open the carrier modules when the unloading pushing member 371 ascends relative to the test tray. As a result, the carrier modules are opened and the unloading picker 32 can then pick up the packaged chips from the carrier modules. The carrier modules are closed, when the unloading pushing members 371 descends.

The unloading pushing unit 37 may include a plurality of the unloading pushing members 371. The plurality of unloading pushing members 371 ascend and descend, independently of each other. The unloading pushing unit 37 may push a specific number of the pins, to open specific number of the carrier modules.

That is, one or more of the unloading pushing members can ascend to selectively open desired ones of the carrier modules. The unloading pushing unit 37 may include a first unloading pushing member 371a, a second unloading pushing member 371b, a third unloading pushing member 371c, and a fourth unloading pushing member 371d, each of which are independently movable. Accordingly, the test tray T may be divided into 4 areas. Of course, in other embodiments, different numbers of areas could be provided. Thus, the unloading pushing unit 37 may selectively open the carrier modules belonging to only one area of the test tray T. The number of the areas that are opened at any given time may depend upon how many packaged chips the unloading picker 32 picks up at a time.

The second unloading pushing member 371b is located adjacent to the first unloading pushing member 371a. The third unloading pushing member 371c is located adjacent to the second unloading pushing member 371b. The fourth unloading pushing member 371d is located adjacent to the third unloading pushing member 371c.

The first and third unloading pushing members 371a and 371c may ascend and descend together. Likewise, the second and fourth unloading pushing members 371b and 371d may ascend and descend together.

If the unloading picker 321 includes multiple unloading pickers 321, the multiple unloading pickers may pick up tested chips from multiple different areas of a test tray at the same time. However, it may make sense for the unloading pickers to pick up chips from areas of the test tray T that are not adjacent to one another so that the multiple unloading pickers 321 do not interfere with one another.

The unloading mechanical actuator 372 is mounted on the unloading ascending/descending member 341 to enable the unloading pushing member 371 to ascend and descend. The unloading mechanical actuator 372 may include multiple pneumatic or hydraulic cylinders, or some other type of moving mechanism.

The unloading pushing unit 37 may include a plurality of the unloading mechanical actuators 372. Multiple unloading mechanical actuators 372 would enable the unloading pushing members 371 to ascend and descend independently. The unloading pushing unit 37 may include a first unloading mechanical actuator 372a, a second unloading mechanical actuator 372b, a third unloading mechanical actuator 372c, and a fourth unloading mechanical actuator 372d.

In the embodiment described above, the first unloading pushing member 371a, the second unloading pushing member 371b, the third unloading pushing member 371c, and the fourth unloading pushing member 371d are enabled to ascend and descend by the first unloading mechanical actuator 372a, the second unloading mechanical actuator 372b, the third unloading mechanical actuator 372c, and the fourth unloading mechanical actuator 372d, respectively.

In the handler as described above, the loading process and the unloading process are simultaneously performed on the two different test trays T which are positioned at different positions, independently of each other. This prevents the loading picker 22 and the unloading picker 32 from colliding with each other. As a result, the loading and unloading processes are simplified, thus reducing and the time for loading the packaged chips intended for the electrical tests and unloading the tested packaged.

Figure 3:
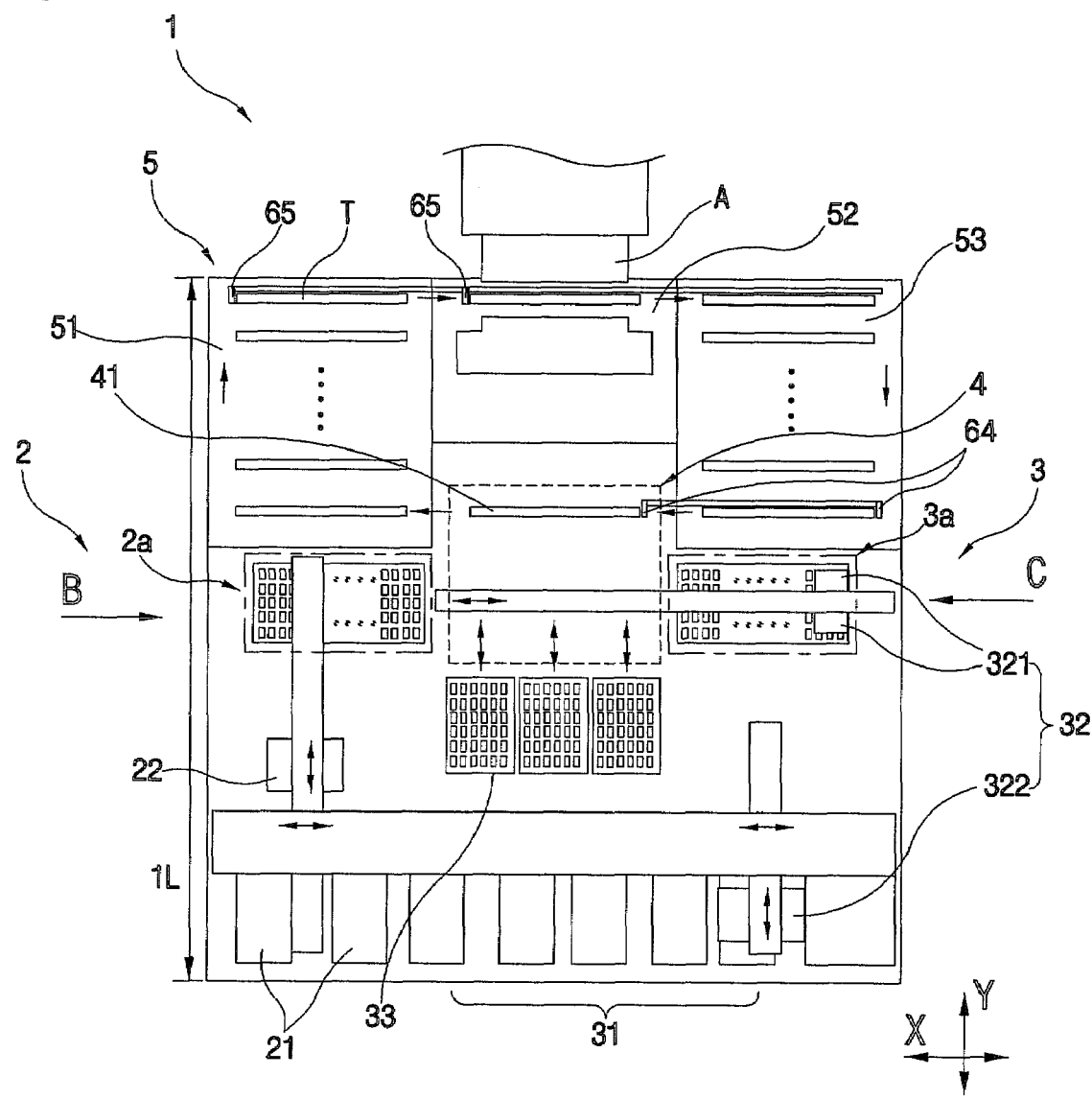
FIG. 3 is a top view of a configuration for a first embodiment of a handler according to the present invention.
Figure 4:
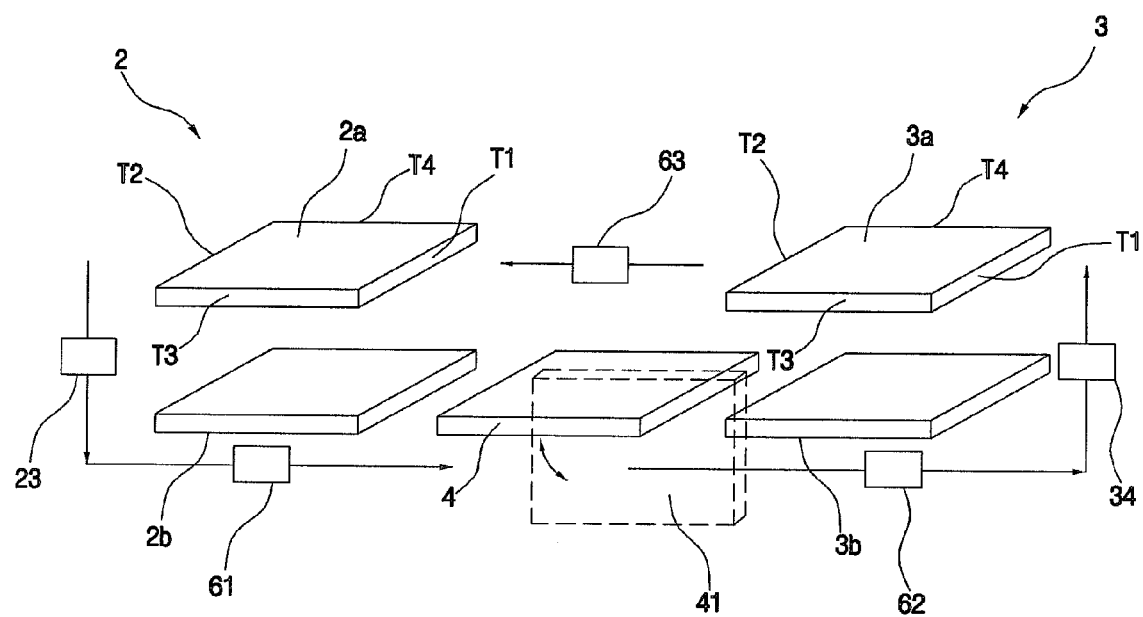
FIG. 4 is a perspective view illustrating a path which a test tray T follows between a loading unit, an unloading unit and a passage site.
Figure 5:
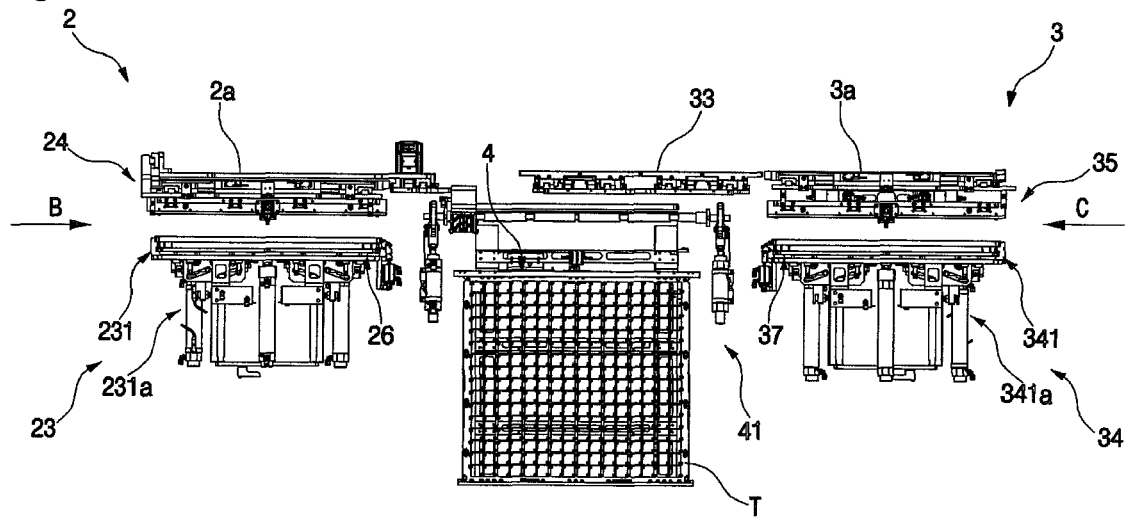
FIG. 5 is a front view of a loading unit, an unloading unit, and a passage site.
Figure 6:
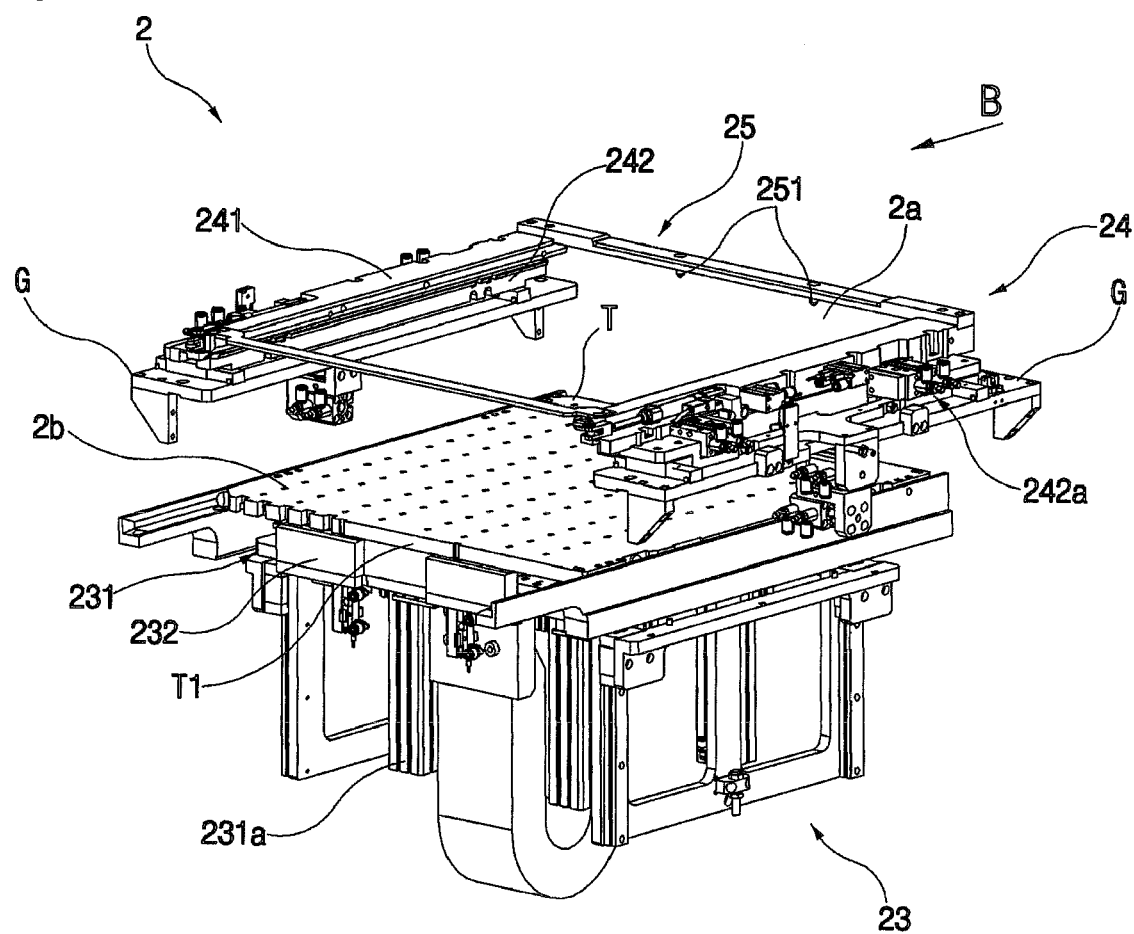
FIG. 6 is a perspective view of a loading ascending/descending unit.
Figure 7:
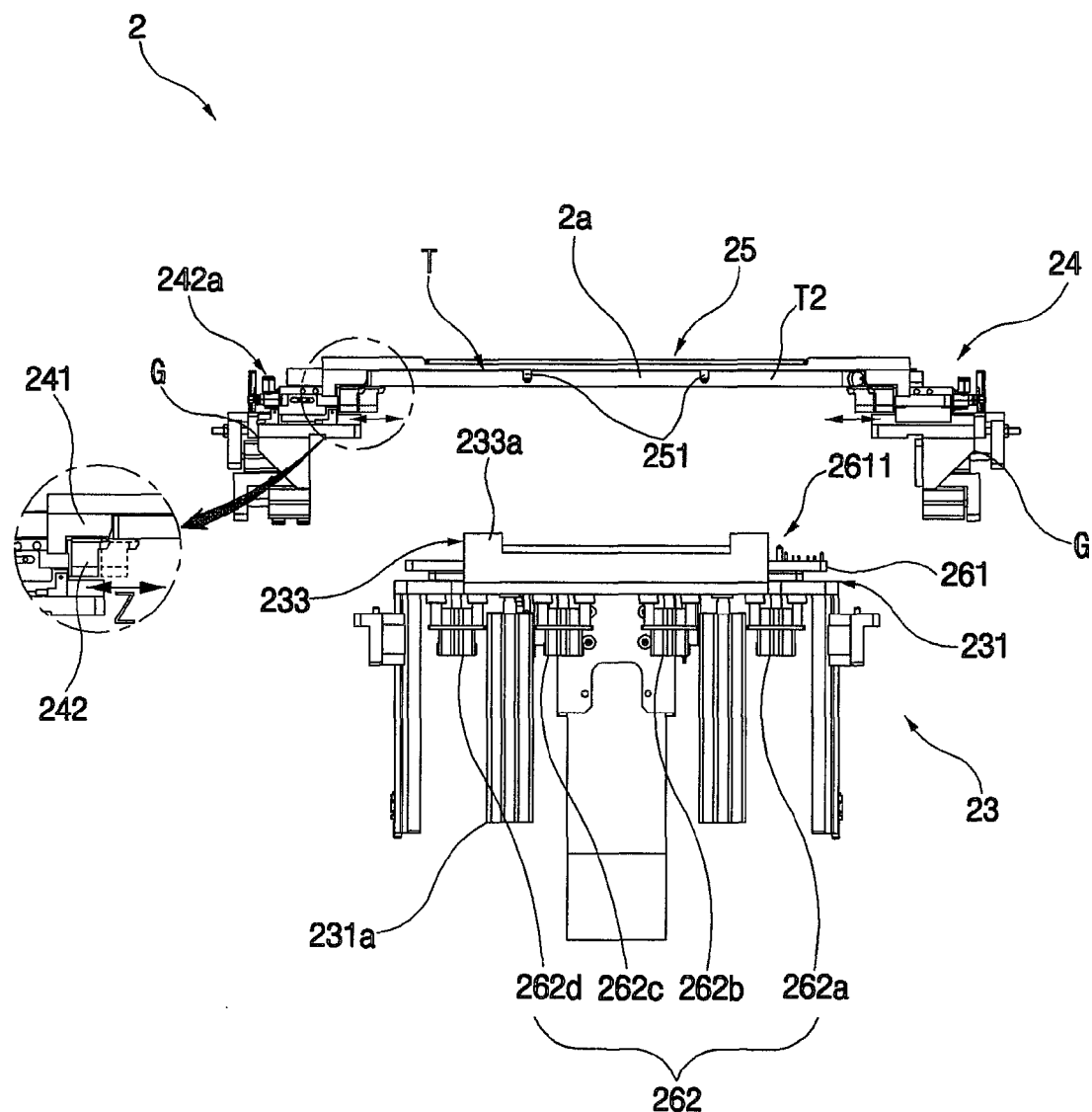
FIG. 7 is a side view of the loading ascending/descending unit observed in the direction of arrow from "B" in FIG. 6, which illustrates how a loading guiding member operates.
Figure 8:
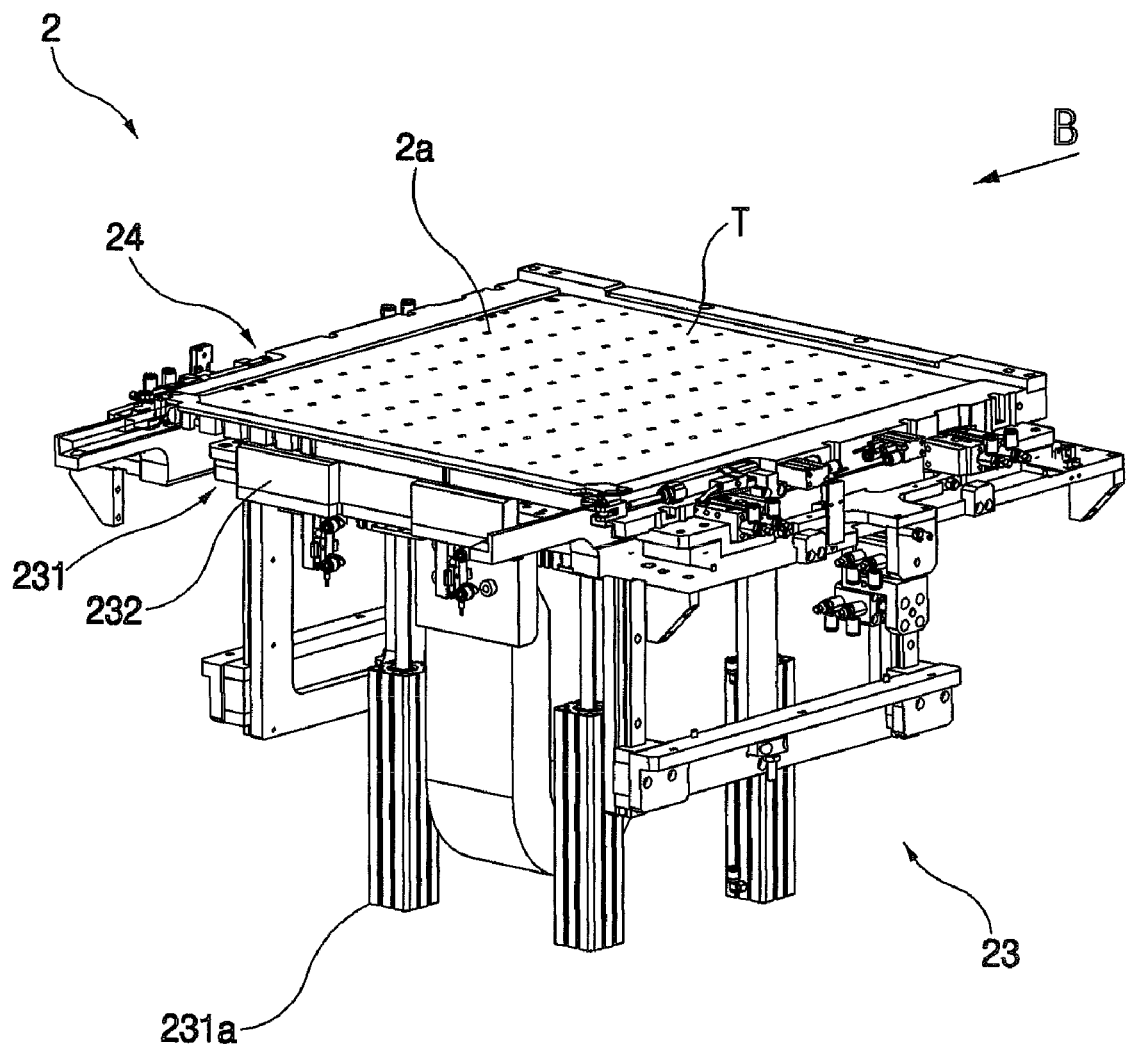
FIG. 8 is a perspective view illustrating a loading ascending/descending member as it ascends in the loading ascending/descending unit of FIG. 6.
Figure 9:
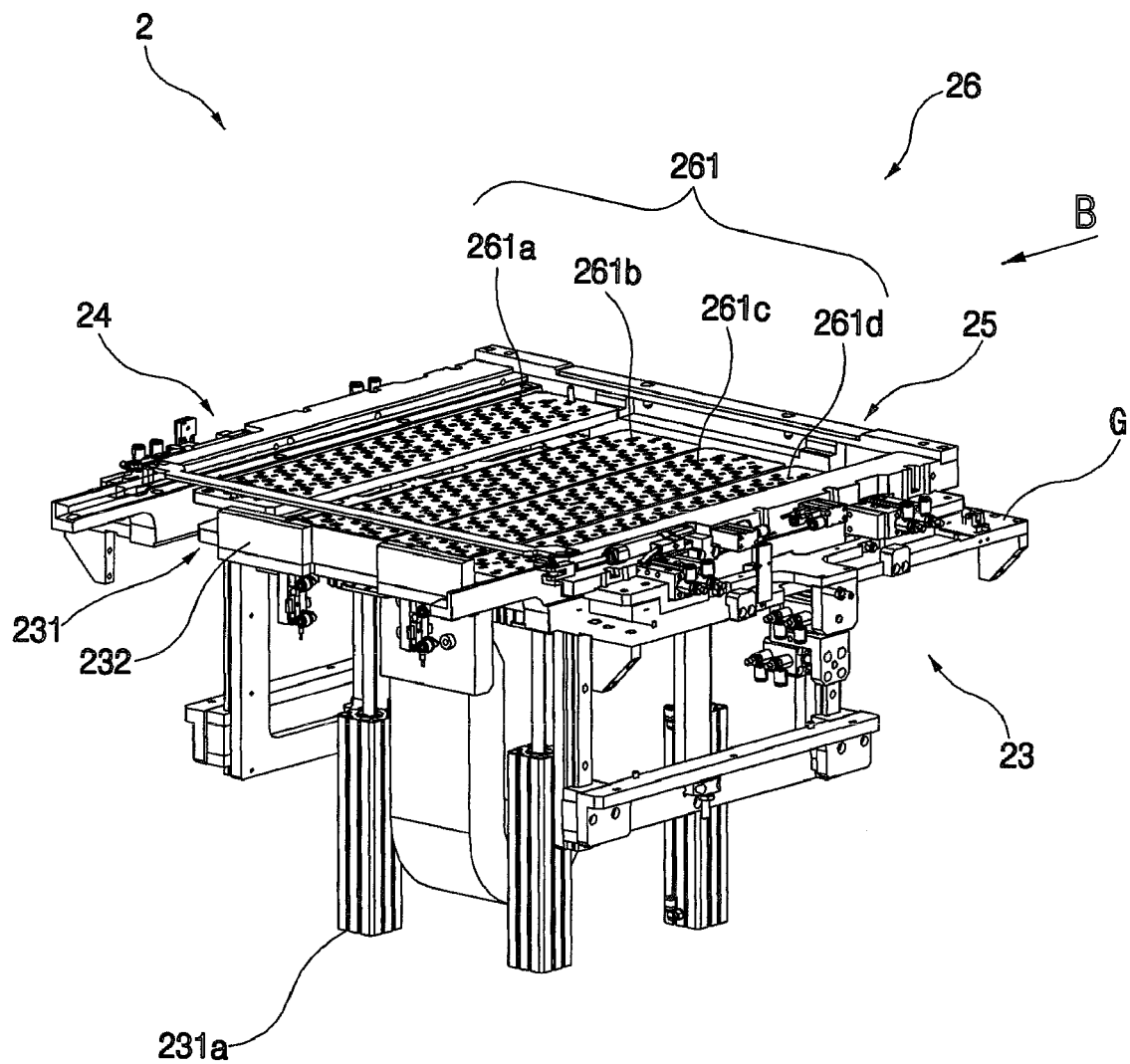
FIG. 9 is a perspective view illustrating a loading pushing unit that is mounted on the loading ascending/descending member, where a portion of the loading pushing unit ascends.
Figure 10:
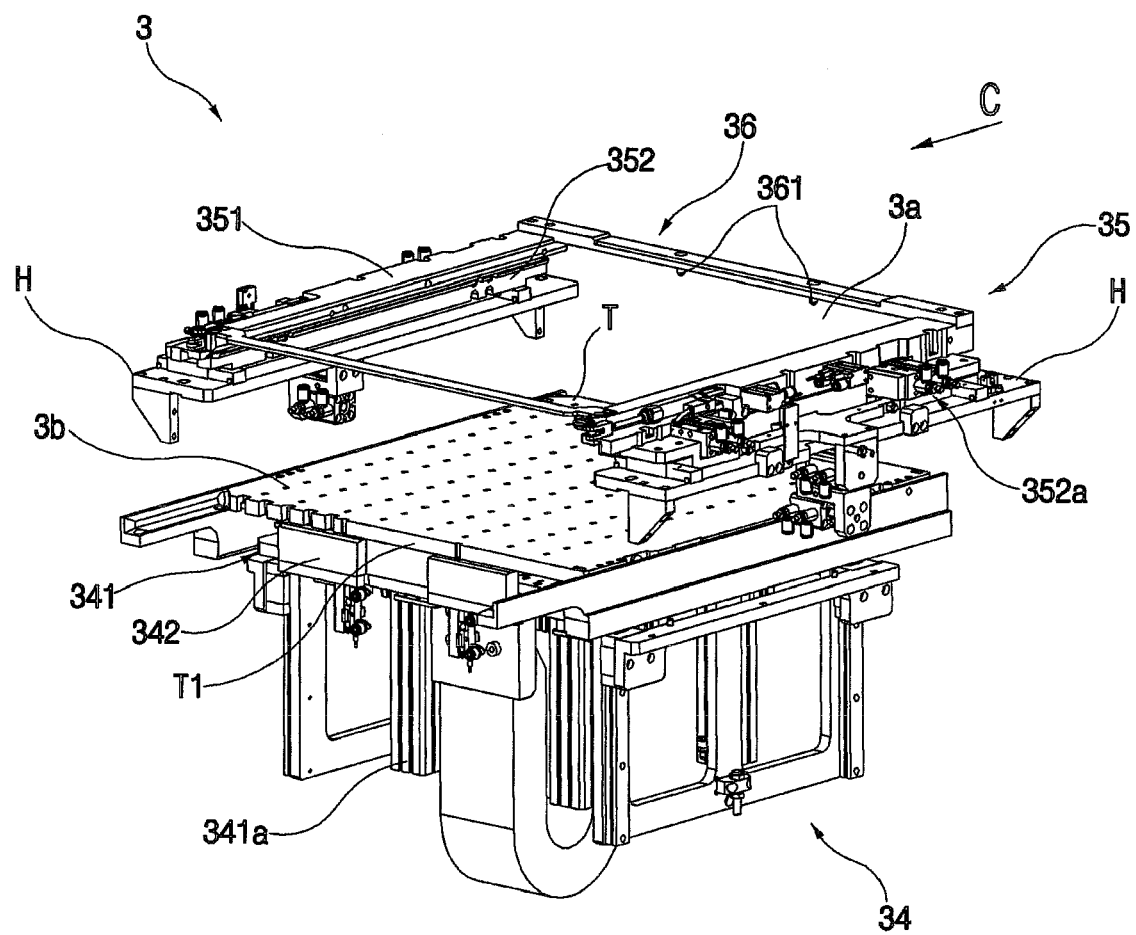
FIG. 10 is a perspective view of an unloading ascending/descending unit.
Figure 11:
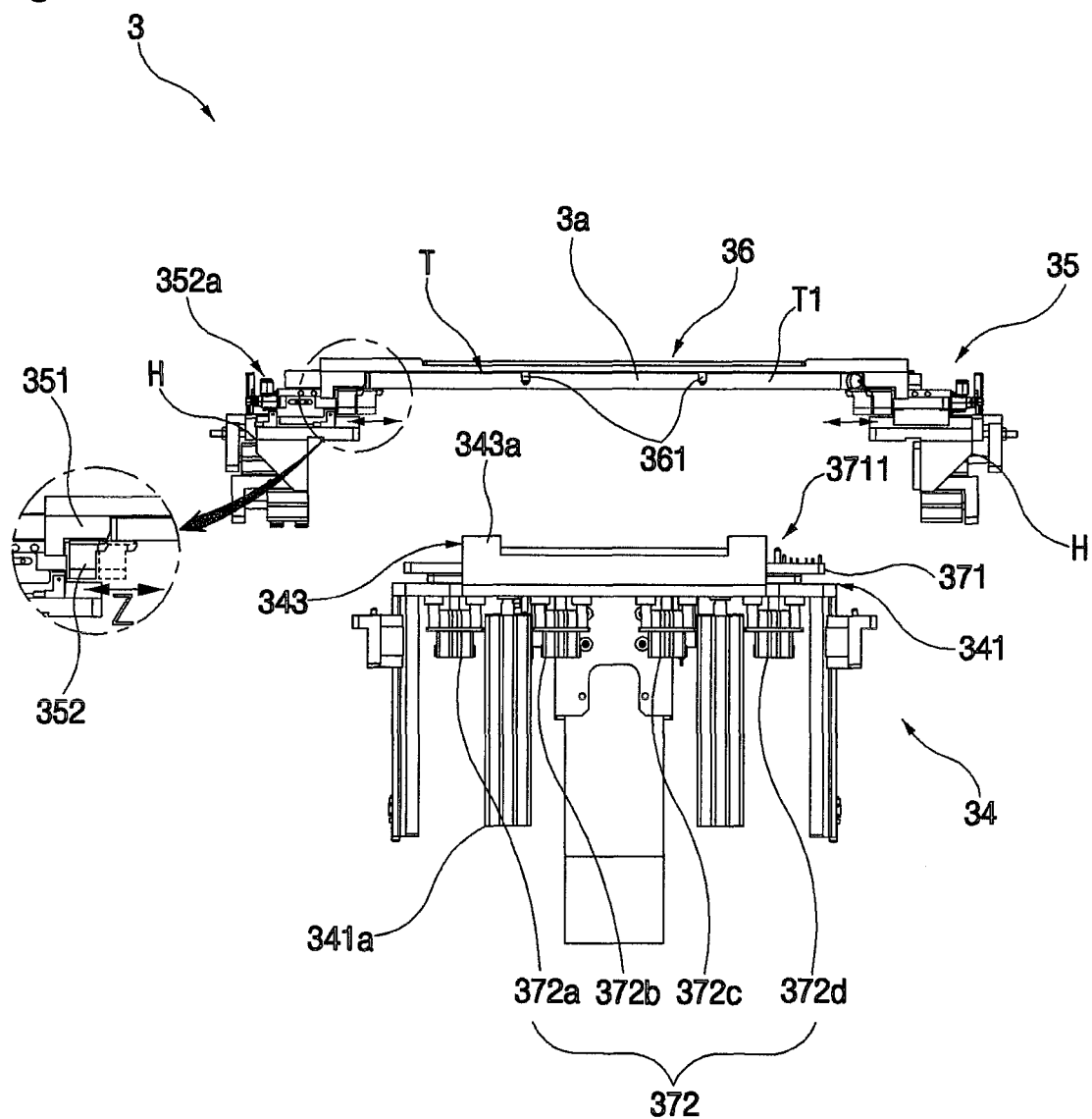
FIG. 11 is a perspective side view of an unloading ascending/descending unit observed in the direction of arrow "C" in FIG. 10, which illustrates how an unloading guiding member operates.
Figure 12:
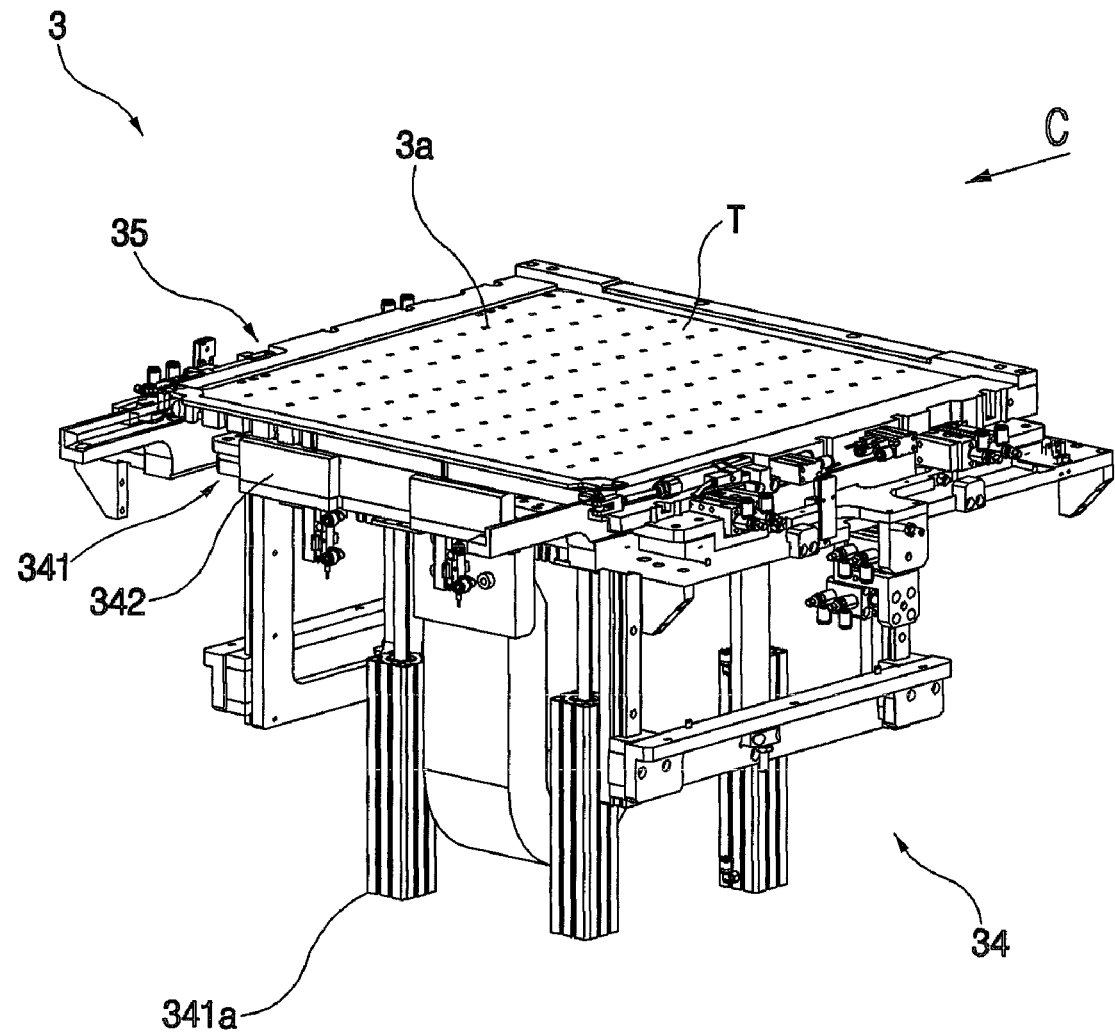
FIG. 12 is a perspective view illustrating an unloading ascending/descending member as it ascends in the unloading ascending/descending unit of FIG. 10.
Figure 13:
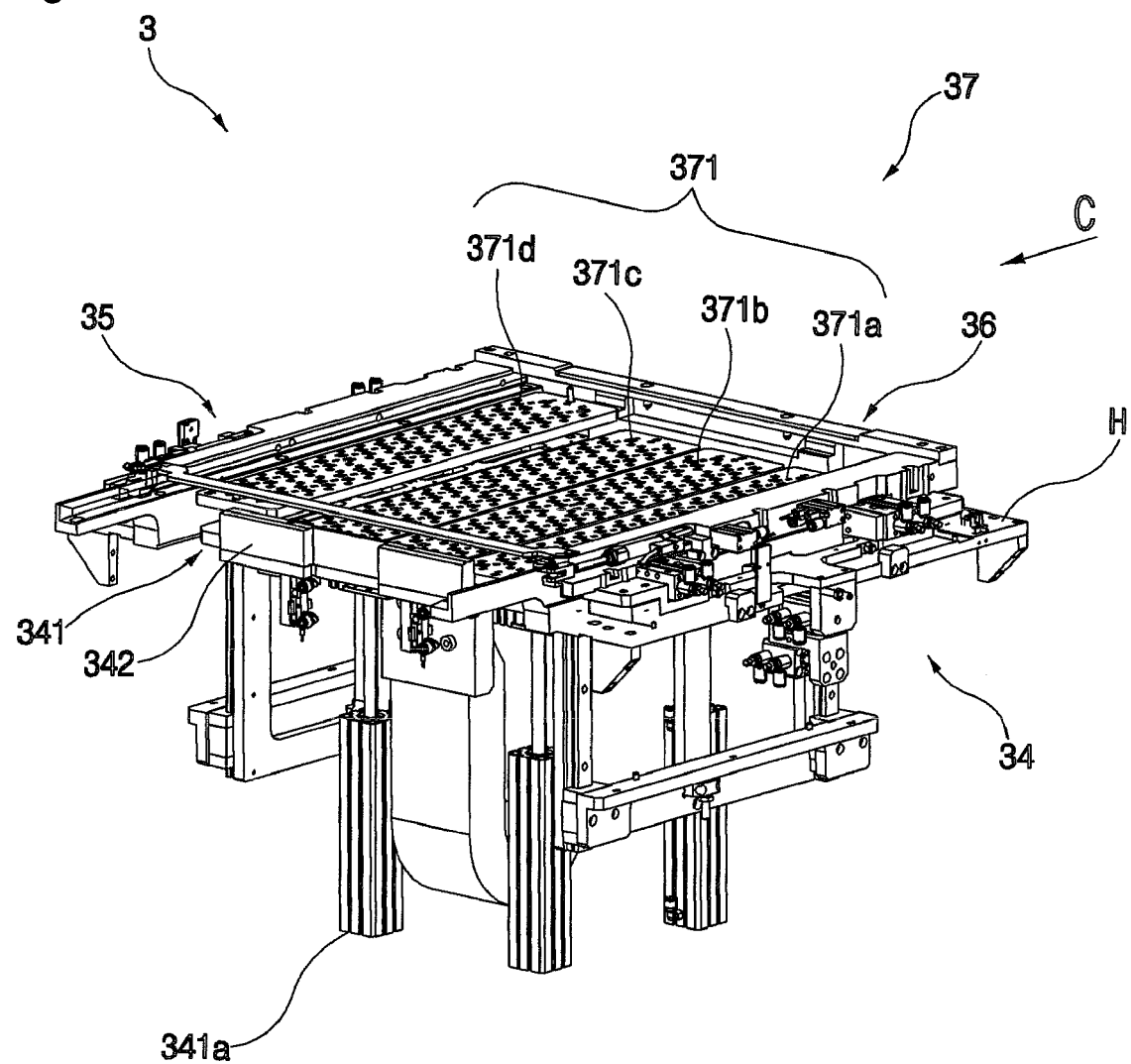
FIG. 13 is a perspective view illustrating an unloading pushing unit that is mounted on an unloading ascending/descending member, where a portion of an unloading pushing unit ascends.

As shown in FIGS. 3-5, the passage site 4 is provided between the departing position 2b and the arriving position 3b. The passage site 4 is located at the same height as the departing position 2b and the arriving position 3b. The passage site 4 is coupled to the loading unit 2 and the chamber system 5. A test tray T is transferred from the loading unit 2 to the chamber system 5, through the passage site 4.

Presence of the passage site 4 in the handler allows a plurality the test trays T to stay at the loading unit 2, the passage site 4, and the unloading unit 3, respectively, thereby reducing the time for the test tray T to wait. The passage site 4 is located below the loading position 2a and the unloading position 3a, thereby contributing to minimizing the length 1 L (shown in FIG. 3) of the handler.

The passage site 4 may further include a rotating unit 41. The rotating unit 41 rotates a test tray T containing the packaged chips intended for the electrical tests from a horizontal position to an upright position. The upright-positioned test tray T is transferred within the chamber system 5

The rotating unit 41 also rotates a test tray T containing the tested packaged chips from an upright position to a horizontal position. Thus, the loading and unloading units 2 and 3 perform the loading and unloading processes on the horizontal positioned test trays T, respectively.

Because a single rotating unit 41 can be used to rotate the test trays between the horizontal and upright positions, this simplifies the test handler as compared to test handlers with two separate rotating units. This also contributes to reducing the space required for the test trays T to rotate in the handler, as compared with the handlers equipped with the two rotating units, one for rotating the horizontal positioned test tray T and the other for rotating the upright-positioned test tray T.

The chamber system 5 may include a first chamber 51, a second chamber 52, and a third chamber 53.

Within the first chamber 51, the packaged chips intended for the electrical tests, contained in the test trays T, are heated or cooled to a testing temperature, which is predetermined depending upon a user's quality requirements. The test tray T containing the packaged chips intended for the electrical tests is the one transferred from the passage site 4. The test tray T is moved forward by a specific distance within the first chamber 51 as the heating or cooling occurs.

After the packaged chips are heated or cooled to a testing temperature, a test tray T is transferred from the first chamber 51 into the second chamber 52. Within the second chamber 52, the packaged chips in the test tray T are brought into contact with sockets of a test board A to receive the electrical tests. This is referred to as "the testing process". The test board A is coupled to the second chamber 52.

After the packaged chips are all tested by a tester, the test tray T is transferred from the second chamber 52 into the third chamber 53. Within the third chamber 53, the tested packaged chips contained in the test tray T are cooled or heated to room temperature. The test trays T are moved forward by a specific distance with the third chamber 53 as the heating or cooling occurs. After the packaged chips are cooled or heated to room temperature, the test tray T is transferred from the third chamber 53 to the passage site 4.

As shown in FIG. 3, the first, second, and third chambers 51, 52, and 53 may be arranged in a row in the horizontal direction (the X-axis direction), in this order. In this arrangement, a plurality of the second chambers 52 may be provided in a column. In other words, one second chamber 52 may be located over another second chamber 52.

The first, second, and third chambers 51, 52, and 53 may also be arranged in a column in the vertical direction (the Y-axis direction), in this order, with the second chamber 52 in between.

As shown in FIGS. 3-5, the transferring unit 6 transfers the test tray T. The transferring unit includes a moving member coupled to the a belt connected between a drive pulley and a driven pulley. A motor drives the drive pulley. The moving member transfers the test tray T by pushing or pulling it.

The transferring unit 6 may include first, second, third, fourth, and fifth transferring units 61, 62, 63, 64, and 65. The first transferring unit 61 transfers a test tray T containing the packaged chips intended for the electrical tests, from the departing position 2b to the passage site 4. The second transferring unit 62 transfers a test tray T containing the tested packaged chips from the passage site 4 to the arriving position 3b.

The third transferring unit 63 transfers a test tray T which became empty after the unloading process, from the unloading position 3a to the loading position 2a. The fourth transferring unit 64 transfers a test tray T containing the packaged chips intended for the electrical tests, from the passage site 4 to the first chamber 51. The fourth transferring unit 64 also transfers a test tray T containing the tested packaged chips from the third chamber 53 to the passage site 4. The fourth transferring unit 64 may transfer a test tray T containing the packaged chips intended for the electrical tests and a test tray T containing the tested packaged chips, at the same time.

The fifth transferring unit 65 transfers a test tray T containing the packaged chips intended for the electrical tests from the first chamber 51 to the second chamber 52 and also transfers a test tray T containing the tested packaged chips from the second chamber 52 to the third chamber 53. The fifth transferring unit 65 may transfer a test tray T containing the packaged chips intended for the electrical tests and a test tray T containing the tested packaged chips, at the same time.

to FIGS. 3-13, a process for testing manufacturing a semiconductor chips is now described.

First, packaged chips are prepared which are to be tested. User trays, each containing the packaged chips, are stacked in the loading stacker 21.

Next, one or more loading pushing members ascend to open corresponding carrier modules on a test tray T at the loading position. Thereafter, the loading picker 22 picks up the packaged chips intended for the electrical tests from a user tray staying at the loading stacker 21 and places them the opened carrier modules. After the packaged chips are all been placed in the open carrier modules, the loading pushing members descend to close the corresponding carrier modules, thereby holding the packaged chips firmly in place.

Next, two second loading guiding members, which support a portion of the lower side of the test tray T, adjacent to a third side T3 of the test tray T and a portion of the lower side of the test tray T adjacent to a fourth side T4 of the test tray T, at the loading position 2a, are moved away from each other. Thereafter, the loading ascending/descending member 231 descends to enable the test tray T to descend from the loading position 2a to the departing position 2b.

Next, the first transferring unit 61 transfers the test tray T from the departing position 2b to the passage site 4. Then the rotating unit 41 rotates the horizontal-positioned test tray T to make it in the upright position.

Next, the fourth transferring unit 64 transfers the test tray T containing the packaged chips intended for the electrical tests from the passage site 4 to the first chamber 51. At the same time, the fourth transferring unit 64 transfers a test tray T containing the tested packaged chips from the third chamber 53 to the passage site 4.

Next, the test tray in the first chamber will move slowly along the chamber as the chips are heated or cooled to a testing temperature. A the packaged chips contained in the test tray T are heated or cooled to the testing temperature within the first chamber 51, the fifth transferring unit 65 transfers the test tray T from the first chamber 51 into the second chamber 52.

The packaged chips contained in the test tray T are then tested within the second chamber 52. Next, the fifth transferring unit 65 transfers the test tray T from the second chamber 52 into the third chamber 53.

The test tray then moves slowly along the third chamber as the packaged chips contained in the test tray T are cooled or heated to room temperature.

Next, the fourth transferring unit 64 transfers the test tray T containing the tested packaged chips from the third chamber 53 to the passage site 4.

The rotating unit 41 rotates the upright-positioned test tray T to make it in the horizontal position. Thereafter, the second transferring unit 62 transfers the test tray T from the passage site 4 to the arriving position 3b.

Next, two second unloading guiding members, which support the portion of the lower side of the test tray T adjacent to the third side T3 of the test tray and the portion of the lower side adjacent to the fourth side T4 of the test tray T at unloading position 3a, are moved apart from each other. Thereafter, the unloading ascending/descending member 341 ascends to enable the test tray T to ascend from the arriving position 3b to the unloading position 3a.

Next, one or more at least two unloading pushing members 371, which are not adjacent to each other, ascend together to open corresponding carrier modules. For example, the first and third unloading pushing members 371a and 371c may ascend together, or the second and fourth unloading pushing members 371b and 371d may ascend together. Thereafter, the unloading picker 32 picks up the tested packaged chips from the opened carrier modules and places them into the corresponding user trays according to the test results. After the unloading picker 32 picks up the tested packaged chips, the unloading pushing members 371 descend to close the corresponding carrier modules.

Next, the two second unloading guiding members 352, which support the lower sides of the test tray T adjacent to the third side T3 and fourth side T4 of the test tray T, at the unloading position 23a, are moved towards each other. Thereafter, when the test tray T become empty, the unloading ascending/descending member 341 descends from the unloading position 3a to the arriving position 3b and the test tray T is transferred from the unloading position 3a to the loading position 2a.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although a number of illustrative embodiments have been described, it should be understood that numerous other modifications and embodiments can be devised by those skilled in the art that will fall within the spirit and scope of the principles of this disclosure. More particularly, variations and modifications are possible in the component parts and/or arrangements which would fall within the scope of the disclosure, the drawings and the appended claims. In addition to variations and modifications in the component parts and/or arrangements, alternative uses will also be apparent to those skilled in the art.

What is claimed is:

1. A test handler, comprising:
   a loading device, comprising:
      a loading picker that places packaged chips into a test tray located at a loading position;
      a loading ascending/descending device that moves the test tray from the loading position to a departing position which is located under the loading position; and
      a loading pushing device that selectively opens a plurality of latches of a plurality of carrier modules on the test tray located at the loading position so that the packaged chips are placed into the plurality of carrier modules by the loading picker, wherein the loading pushing device comprises a plurality of loading pushing members that is coupled to the loading ascending/descending device, and wherein the plurality of loading pushing members ascend and descend independent of each other;
   an unloading device comprising:
      an unloading picker that removes the packaged chips from the test tray located at an unloading position;
      an unloading ascending/descending device that moves the test tray from an arriving position located under the unloading position to the unloading position; and
      an unloading pushing device that selectively opens the plurality of latches of the plurality of carrier modules on the test tray located at the unloading position so that the packaged chips are removed from the plurality of carrier modules by the unloading picker, wherein the unloading pushing device comprises a plurality of unloading pushing members that is coupled to the unloading ascending/descending device, and wherein the plurality of unloading pushing members ascend and descend independent of each other;
   a chamber where the packaged chips are brought into contact with a test board; and
   a passage site that connects the loading device and the chamber, and connects the chamber and the unloading device.

2. The test handler of claim 1, further comprising a transferring device that transfers the test tray from the passage site to the arriving position, from the unloading position to the loading position, and from the departing position to the passage site.

3. The test handler of claim 1, wherein the loading pushing device selectively opens at least one of the plurality of carrier modules of the test tray.

4. The test handler of claim 1, wherein the unloading pushing device selectively opens at least one of the plurality of carrier modules of the test tray.

5. The test handler of claim 1, wherein at least two of the plurality of loading pushing members ascend together, and wherein at least two of the plurality of unloading pushing members ascend together.

6. The test handler of claim 1, wherein the loading pushing device further comprises a plurality of loading mechanical actuators which causes the plurality of loading pushing members to ascend and descend independent of each other, and wherein the unloading pushing device further comprises a plurality of unloading mechanical actuators which causes the plurality of unloading pushing members to ascend and descend independent of each other.

7. The test handler of claim 1, wherein the loading device further comprises a loading guiding member that guides motion of the test tray at the loading position when the test tray is transferred from the unloading position to the loading position, and wherein the unloading device further comprises an unloading guiding member that guides motion of the test tray at the unloading position when the test tray is transferred from the unloading position to the loading position.

8. The test handler of claim 7, wherein the loading guiding member comprises two first loading guiding members and two second loading guiding members into which two sides of the test tray are inserted as the test tray is transferred from the unloading position to the loading position, wherein the two first loading guiding members are fixedly mounted on a loading frame located at the loading position, wherein the two second loading guiding members are located under the two first loading guiding members, and wherein the two second loading guiding members are movably mounted on the loading frame such that the two second loading guiding members move toward and away from each other.

9. The test handler of claim 8, wherein the unloading guiding member comprises two first unloading guiding members and two second unloading guiding members into which two sides of the test tray are inserted as the test tray is transferred from the unloading position to the loading position, wherein the two first unloading guiding members are fixedly mounted to an unloading frame located at the unloading position, wherein the two second unloading guiding members are located under the first unloading guiding members, and wherein the two second unloading guiding members are movably mounted to the unloading frame such that the two second loading guiding members move toward and away from each other.

10. The test handler of claim 1, wherein the loading ascending/descending device comprises a loading ascending/descending member that ascends and descends between the loading position and the departing position and a first loading supporter and a second loading supporter coupled to the ascending/descending member which support a lower side of the test tray, and wherein the second loading supporter further comprises at least one loading supporting member which is brought into contact with a side of the test tray that fixes the test tray in the loading position as the test tray is moved from the unloading position to the loading position.

11. The test handler of claim 1, wherein the unloading ascending/descending device comprises an unloading ascending/descending member that ascends and descends between the unloading position and the arriving position and a first unloading supporter and a second unloading supporter coupled to the ascending/descending member which support a lower side of the test tray, and wherein the second unloading supporter further comprises at least one unloading supporting member which is brought into contact with a side of the test tray that fixes the test tray in the arriving position as the test tray is moved from the passage site to the arriving position.

12. The test handler of claim 1, wherein the loading device further comprises a loading stopper having at least one loading protruding member which is brought into contact with a side of the test tray that fixes the test tray in the loading position as the test tray is transferred from the unloading position to the loading position, and wherein the loading stopper is detachably coupled to a loading frame located at the loading position.

13. The test handler of claim 1, wherein the unloading device further comprises an unloading stopper having at least one unloading protruding member which is brought into contact with a side of the test tray that fixes, the test tray in the unloading position and wherein the unloading stopper is detachably coupled to an unloading frame located at the unloading position.

14. The test handler of claim 1, wherein the passage site further comprises a rotating device which rotates the test tray between horizontal and vertical positions.

15. A test handler, comprising:
   a loading unit, comprising:
      a loading picker that places packaged chips into a test tray located at a loading position;
      a loading ascending/descending unit that moves a test tray from the loading position to a departing position which is located under the loading position; and
      a loading guiding member that guides motion of the test tray at the loading position when the test tray is transferred from an unloading position to the loading position;
   an unloading unit, comprising:
      an unloading picker that removes packaged chips from a test tray located at the unloading position;
      an unloading ascending/descending unit that moves a test tray from an arriving position located under the unloading position to the unloading position; and
      an unloading guiding member that guides motion of the test tray at the unloading position when the test tray is transferred from the unloading position to the loading position;
   a chamber system where the packaged chips are brought into contact with a test board; and
   a passage site that connects the loading unit and the chamber system, and that connects the chamber system and the unloading unit, wherein the loading guiding member comprises two first loading guiding members and two second loading guiding members into which two sides of the test tray are inserted as the test tray is transferred from the unloading position to the loading position, wherein the two first loading guiding members are fixedly mounted on a loading frame located at the loading position, and wherein the two second loading guiding members are located under the two first loading guiding members, and wherein the two second loading guiding members are movably mounted on the loading frame such that they can move towards and away from each other.

16. A test handler, comprising:
   a loading unit, comprising:
      a loading picker that places packaged chips into a test tray located at a loading position; and
      a loading ascending/descending unit that moves a test tray from the loading position to a departing position which is located under the loading position, wherein the loading ascending/descending unit comprises:
         a loading ascending/descending member that ascends and descends between the loading position and the departing position; and
         a first loading supporter and a second loading supporter coupled to the ascending/descending member so as to support a lower side of the test tray, wherein the second loading supporter comprises at least one loading supporting member which is brought into contact with a side of the test tray so as to fix the test tray in the loading position as the test tray is moved from the unloading position to the loading position;

an unloading unit, comprising:
- an unloading picker that removes packaged chips from a test tray located at an unloading position; and
- an unloading ascending/descending unit that moves a test tray from an arriving position located under the unloading position to the unloading position;

a chamber system where the packaged chips are brought into contact with a test board; and a passage site that connects the loading unit and the chamber system, and that connects the chamber system and the unloading unit.

17. A test handler, comprising:

a loading unit, comprising:
- a loading picker that places packaged chips into a test tray located at a loading position; and
- a loading ascending/descending unit that moves a test tray from the loading position to a departing position which is located under the loading position;

an unloading unit, comprising:
- an unloading picker that removes packaged chips from a test tray located at an unloading position; and
- an unloading ascending/descending unit that moves a test tray from an arriving position located under the unloading position to the unloading position, wherein the unloading ascending/descending unit comprises:
  - an unloading ascending/descending member that ascends and descends between the unloading position and the arriving position; and
  - a first unloading supporter and a second unloading supporter coupled to the ascending/descending member so as to support a lower side of the test tray, wherein the second unloading supporter comprises at least one unloading supporting member which is brought into contact with a side of the test tray so as to fix the test tray in the arriving position as the test tray is moved from a passage site to the arriving position; and a chamber system where the packaged chips are brought into contact with a test board, wherein the passage site connects the loading unit and the chamber system, and connects the chamber system and the unloading unit.

* * * * *